United States Patent [19]

Lu

[11] Patent Number: 5,162,682
[45] Date of Patent: Nov. 10, 1992

[54] SOLID STATE RELAY EMPLOYING TRIACS AND PLURALITY OF SNUBBER CIRCUITS

[76] Inventor: Chao-Cheng Lu, 4-4, Alley 27, Lane 143, Chun Kung Rd., Taipei, Taiwan, 11614

[21] Appl. No.: 645,036

[22] Filed: Jan. 22, 1991

[51] Int. Cl.⁵ ............................................. H03K 17/72
[52] U.S. Cl. ................................... 307/631; 307/311; 307/632; 307/638
[58] Field of Search ............... 307/631, 632, 638, 646, 307/311

[56] References Cited

U.S. PATENT DOCUMENTS 3,940,634 2/1976 Grogan ................... 307/643
4,157,481 6/1979 Walton ................... 307/643

FOREIGN PATENT DOCUMENTS 0017260 2/1978 Japan ................... 307/643

Primary Examiner—John Zazworsky
Attorney, Agent, or Firm—Jacobson, Price, Holman & Stern

[57] ABSTRACT

A solid state relay comprising an input terminal, an optical coupler, a reference voltage circuit, a light dependent resistor circuit, a triac driver circuit, a triac circuit, an output terminal and a snubber circuit, and being constructed in such a way that it can turn ON and OFF a supply of AC power to the load.

12 Claims, 2 Drawing Sheets

SOLID STATE RELAY EMPLOYING TRIACS AND PLURALITY OF SNUBBER CIRCUITS

BACKGROUND OF THE INVENTION

There are many kinds of solid state relays available now. Most have triac thyristors that act as main switches which are triggered by diac semiconductors to provide a controlled ON and OFF function. The present invention uses a trigger circuit consisting of a silicon controlled rectifier (SCR), a full wave rectifier bridge circuit and a light dependent resistor to trigger the main triac switch circuit. With the use of snubber circuits, the solid state relay of the present invention supersedes functionally of such devices heretofore known.

SUMMARY OF THE INVENTION

The solid state relay of the present invention comprises an input circuit, an optical coupler, a reference voltage circuit, a light dependent resistor circuit, a triac driver circuit, a triac circuit, an output circuit and a snubber circuit. A voltage applied to the input circuit is relayed through the various circuitry to control connection of an AC power to a load, both of which are connected in the output circuit.

The input circuit provides a pulse, DC, or AC voltage to control the triac drive circuit and to control the triac circuit to perform ON and OFF functions in the output circuit.

The optical coupler circuit comprises an optical coupler integrated circuit (IC) which is designed to provide insulation between the input and output terminals and to respond to the voltage applied at the input circuit.

The reference voltage circuit comprises a resistor and a zener diode, and is designed to place the output terminal of the optical coupler IC at a voltage of fixed value as required by the SCR driver circuit.

The light dependent resistor circuit consists of light dependent resistors, each of which comprises a light-emitting diode (LED) and a cadmium sulfide (CDS) photoconductive cell and is designed to control the ON and OFF functions of triac drive circuit, triac circuit and snubber circuit.

The triac drive circuit comprises a triac, a full wave rectifier bridge and an SCR and is designed to supply the triac circuit with sufficient trigger current and voltage to perform the ON and OFF functions smoothly.

The above and other objects and advantages of the present invention will become more readily apparent when reference is made to the following description taken in conjunction with the accompanying drawings.

DETAILED DESCRIPTION OF THE DRAWINGS

Figure 1:
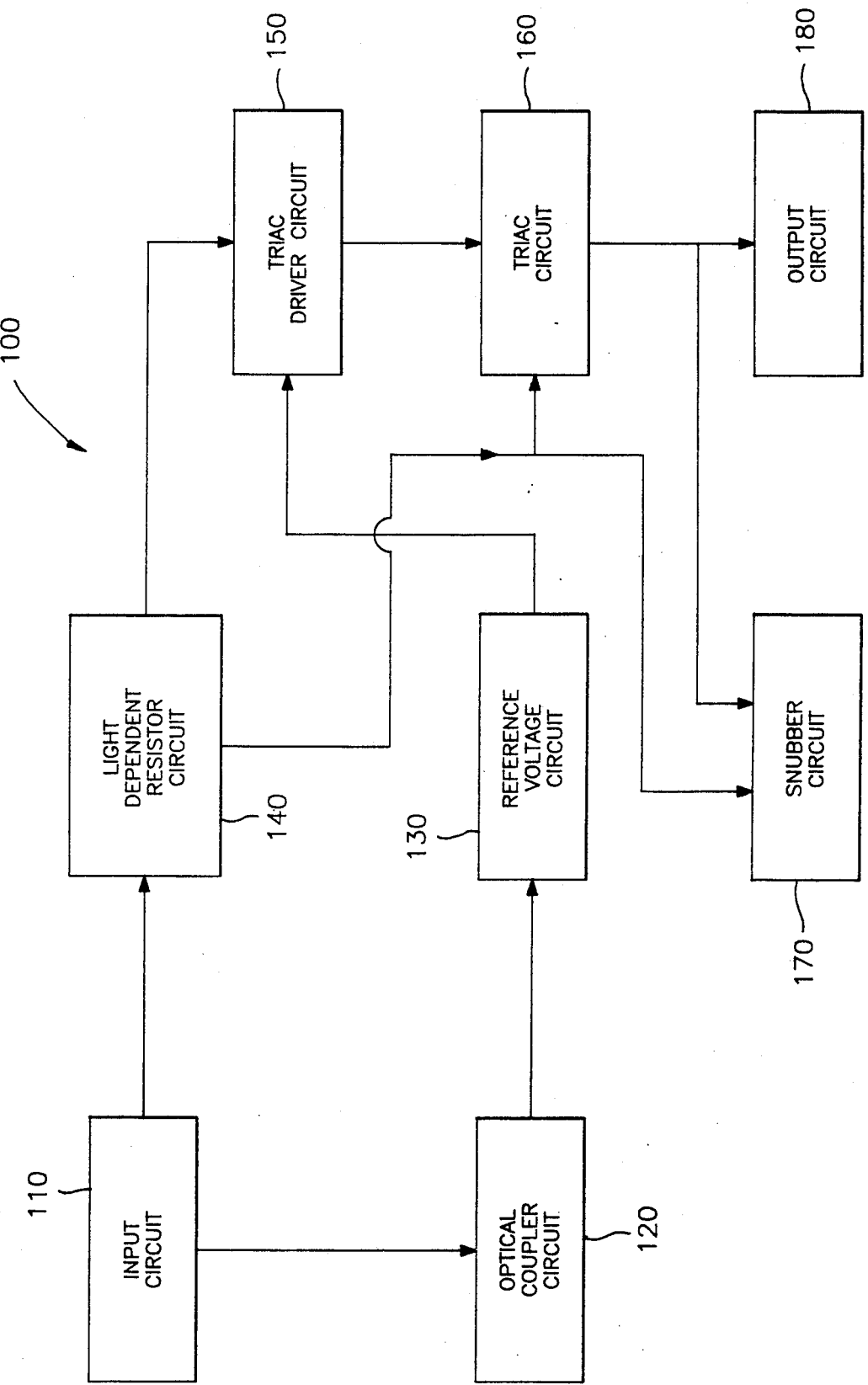
FIG. 1 is a block diagram of the solid state relay of the present invention.

Referring first to FIG. 1, the solid state relay of the present invention is shown generally at 100 and comprises an input circuit 110; an optical coupler circuit 120; a reference voltage circuit 130; a light dependent resistor circuit 140; a triac driver circuit 150; a triac circuit 160; a snubber circuit 170; and an output circuit 180.

Generally, the input circuit 110 receives a positive voltage, either pulse, DC or AC, which is relayed for the ON-off control of AC power from an AC source 115 to a load in the output circuit 180. The optical coupler circuit 120 isolates the input circuit and the triac drive circuit 150 and controls the triac drive circuit 150. The reference voltage circuit 130 provides the triac drive circuit 150 with a reference voltage. The triac drive circuit 150 provides the triac circuit 160 with a trigger voltage, which ultimately provides the ON-off control of the AC power to the load in the output circuit 180.

The light dependent resistor circuit 140 controls the triac drive circuit 150, the triac circuit 160 and the snubber circuit 170, which circuit 140 is controlled by positive voltage at the input circuit 110. The snubber circuit 170, consists of one of four alternative circuits 170A-170D (FIG. 2), selected by a switch, each of which protects the triac thyristor of the triac circuit 160. As mentioned above, the output circuit facilitates connection of AC power to a load, under control of the triac circuit 160.

Figure 2:
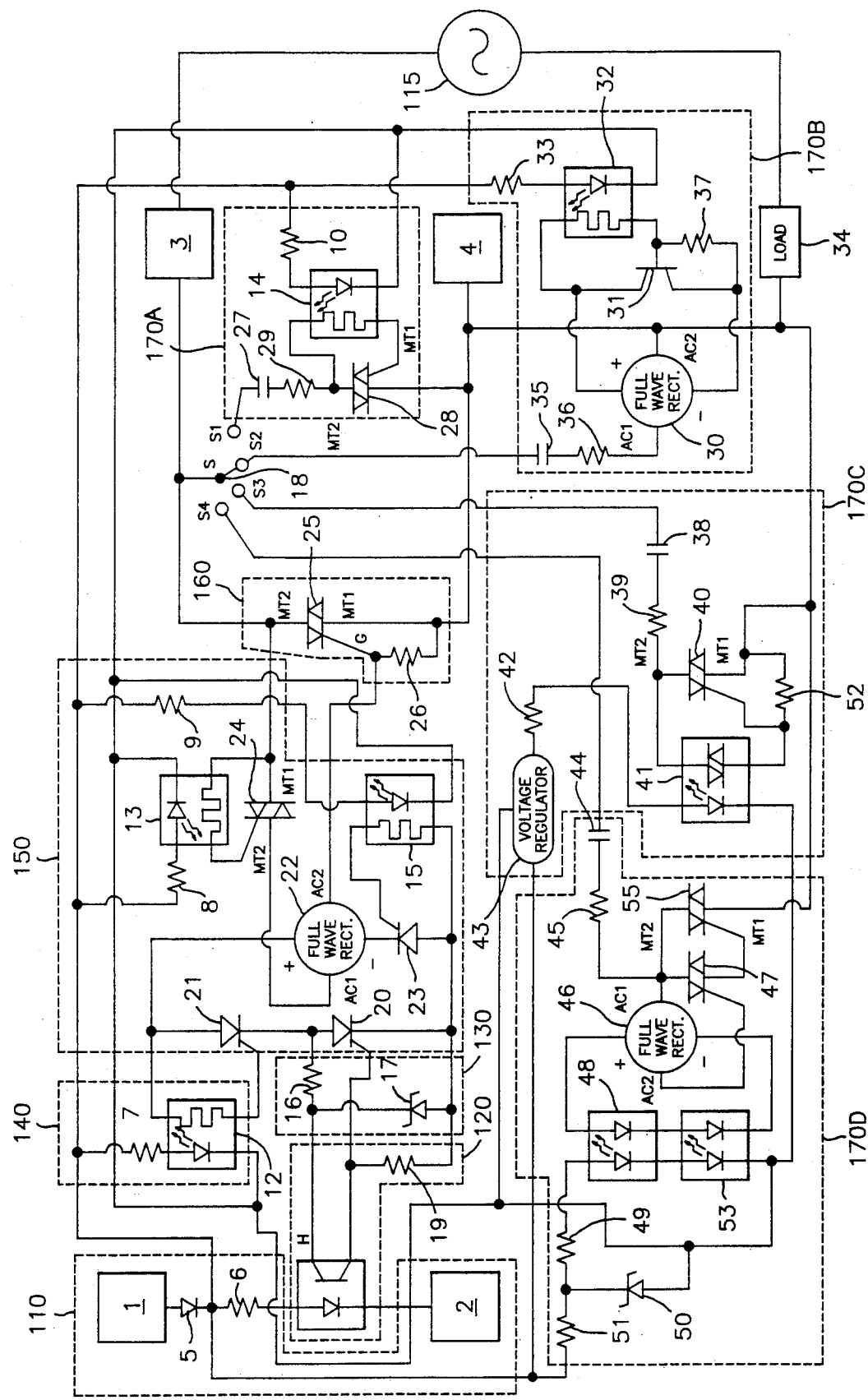
FIG. 2 is a schematic circuit diagram of the solid state relay of the present invention.

Turning now to FIG. 2, a detailed description of the solid state relay circuit 100 will now be made. The input circuit 110 comprises first and second terminals, labelled 1 and 2 respectively, a diode 5 and a current limiting resistor 6. The input circuit 110 connects to the optical coupler circuit 120 via the current limiting resistor 6.

The optical coupler circuit 120 comprises an optical coupling element 11 and a gate resistor 19. The optical coupler circuit 120 connects to the reference voltage circuit 130 at the leads taken off the optical coupler element and the gate resistor 19.

The reference voltage circuit 130 comprises a voltage drop resistor 16 and a zener diode 17, connected to one end of the voltage drop resistor 16. The reference voltage circuit 130 is connected to the triac driver circuit 150 via the other terminal of the voltage drop resistor 16.

The light dependent resistor circuit 140 comprises a light dependent resistor (LDR) element 12 which includes a LED and a cadmium sulfide (CDS) cell, and a current limiting resistor 7. The LED of the LDR 12 is connected via the current limiting resistor 7 to the node between the diode 5 and current limiting resistor 6 of the input circuit 110. The output of the LDR 12 is taken across the CDS and is supplied to the triac drive circuit 150.

The triac drive circuit 150 comprises three silicon controlled rectifiers (SCR's) 20, 21 and 23. SCR 21 connects to the LDR 12 of the light dependent resistor circuit 140 and SCR 20 is connected to the voltage drop resistor 16. The drive circuit 150 further comprises a full wave rectifier element 22 having positive and negative output terminals as well as AC input terminals AC1 and AC2. SCR 23 is connected to the negative output terminal of the full wave rectifier element 22 and also connects to a LDR 15. A second LDR 13 is provided and connects to the light dependent resistor circuit 140 through a current limiting resistor 8. The resistor 9 is also connected to the light dependent resistor circuit 140 at one end and to the LDR 15 at its other end. A thyristor triac 24 is provided having terminals MT1 and MT2, and a gate, the gate and terminal MT1 being connected in parallel with the LDR 13 and terminal MT2 being connected to terminal AC1 of the full wave rectifier 22.

The triac circuit 160 comprises a triac 25 having terminals MT1 and MT2 and a gate, and a gate resistor 26 connected to the gate and terminal MT1, and also to AC input terminal AC2 of the full wave rectifier 22 in the triac driver circuit 150.

As mentioned above, the snubber circuit 170 includes four alternative circuit configurations 170A–170D, the selection being made by the single pole double throw switch 18. There are four switch positions to which switch 18 may be placed. Switch positions S1–S4 correspond to selection of one of the circuit configurations 170A–170D, respectively. The switch 18 connects one of these circuits to the terminal MT1 of the triac 25 and also to output terminal 3. The load 34 is connected to the output terminal 4.

Snubber circuit configuration 170A comprises a snubber capacitor 27 and a snubber resistor 29, connected in series, which series combination is connected to a terminal MT2 of a triac 28. The other terminal, MT1 of the triac 28 is connected to the output terminal 4 and to terminal MT1 of triac 25 in the triac circuit 160. A LDR 14 is connected in parallel with terminals MT1 and MT2 of the triac 28, the LED of which is connected via resistor 10 to the input terminals 1 and 2.

Snubber circuit configuration 170B comprises a snubber capacitor 35 and snubber resistor 36 series combination which is connected to a full wave rectifier element 30 at AC input terminal AC1 of the rectifier element 30. A transistor 31 is connected at its collector and emitter to the positive and negative output terminals, respectively, of the full wave rectifier element 30. Terminal AC2 of the rectifier element 30 is connected to output terminal 4. An LDR 32 is provided, the LED of which is connected via resistor 33 to the input terminals 1 and 2. The LDR 32 is connected to the base and collector of the transistor 31, a resistor 37 being also connected between the base and emitter of the transistor 31.

Snubber circuit configuration 170C comprises a snubber capacitor 38 and a snubber resistor 39 series combination, which is connected to terminal MT2 of a triac 40. A resistor 52 is connected between the gate and terminal MT1 of the triac 40. The triac 40 is connected to a phototriac coupler 41. The phototriac coupler 41 is also connected to the output of a three terminal voltage regulator 43 via a current limiting resistor 42. The voltage regulator 43 is connected at its input to the input terminals 1 and 2. Terminal MT1 of the triac 40 is connected to the load 34.

Snubber circuit configuration 170D comprises a snubber capacitor 44 and a snubber resistor 45 series combination connected to AC input terminal AC1 of a full wave rectifier element 46. First and second triac's 47 and 55 are connected at terminals MT2 to the input terminal AC1 of the full wave rectifier element 46 and at terminal MT1 to input terminal AC2 of the full wave rectifier element 46. A series combination of photothyristor couplers 48 and 53 are connected in parallel with the positive and negative output terminals of the full wave rectifier element 46. A current limiting resistor 49 is connected to the phototriac coupler 48 and to a voltage drop resistor 51, which is connected to input terminal 1. A zener diode 50 is connected at one end to input terminal 2 and at the other end to a node between the resistors 49 and 51.

In operation, referring to FIG. 2, the AC power source 115 is connected to the output terminal 3, current therefrom is divided into three parts: one part is supplied to terminal MT2 of triac 25 and the other two parts to terminal MT2 of triac 24 of triac drive circuit 150 and to the main contact of switch 18, respectively. The output terminal 4 is connected to terminal MT1 of triac 25, to terminal MT1 of triac 28 of the snubber circuit configuration 170A, and to terminal AC2 of the full wave rectifier element 30 in snubber circuit configuration 170B. The output terminal 4 is connected to one terminal of the load 34, the other terminal of the load 34 being connected to the other terminal of AC power source 115.

When the AC power source 115 at the output terminal 3 is at its positive half cycle, the positive voltage will reach the main contact of the switch 18 and terminal MT2 of triac 25, and will trigger terminal MT2 of triac 24 and the CDS cell of LDR 13. When the input terminals 1 and 2 have no voltage applied thereto, the positive voltage of the positive half cycle is off at the output terminals opening the output circuit.

When the input terminals 1 and 2 have a voltage applied thereto to close the output circuit, the positive voltage goes through the current limit resistor 2 to the LED of LDR 13 and causes the LED to go ON. At this time, the resistance of the CDS cell of the LDR 13 changes from an infinite value to low value. The positive voltage, therefore, goes through the CDS cell of LDR 13 to the other terminal of the CDS cell and then to the gate of triac 24. The positive voltage of positive half cycle goes from terminal MT2 of triac 24 to terminal MT1 and terminal AC1 of the full wave rectifier element 22, and is supplied at the positive terminal of full wave rectifier element 22 to the anode of SCR 21 of driver circuit 150 and the CDS cell of LDR 12.

With the input terminals 1 and 2 at an input voltage, the LED of LDR 12 lowers the resistance of the CDS cell of LDR 12. Consequently, the positive voltage of the SCR 21 goes through the CDS cell of LDR 12 to the gate of the SCR 21 and is sent out through the anode and cathode of the SCR 21 to the anode of the SCR 20 as well as to one terminal of the voltage drop resistor 16 of the reference voltage circuit 130. The voltage through the diode 5 and current limit resistor 6 to the LED of optical coupler IC 11 places the collector and emitter of optical coupler IC 11 in the ON state. The series zener voltage of voltage drop resistor 16 and zener diode 17 is applied to the collector and emitter of optical coupler IC 11, to the gate of the SCR 20 and to the two terminals of the gate resistor 19. Since the gate of the SCR 20 has voltage applied thereto, the SCR 20 is turned ON and the positive voltage goes from the anode to the cathode of the SCR 20 and then to the anode of the SCR 23 and the CDS cell of LDR 15.

Similarly, as a result of the voltage applied at the input terminals 1 and 2, the LED of LDR 15 is triggered ON. The resistance of the CDS cell of LDR 15 thereby is lowered and the positive voltage goes from the anode to the cathode of the SCR 23 and is applied to the negative terminal of the full wave rectifier element 22. From the terminal AC2 to the gate, a positive voltage is applied to gate resistor 26 of triac 25 of the triac circuit 160. Therefore, the voltage at the gate of triac 25 is applied from the two terminals of the gate resistor 26. With the gate of triac 25 at a positive voltage, the positive voltage of terminal MT2 of triac 25 is applied through terminal MT1 and output terminal 4, to the load 34 of which the other terminal is connected to the AC power source 115, to thereby complete a switch circuit.

When the voltage at input terminals 1 and 2 is zero, the collector and emitter of optical coupler IC 11 are in an OFF state and the LDR 12, LDR 13, LDR 14, LDR 15 and LDR 32 are in an OFF state, also. Thus, an open circuit condition is created in the output circuit.

The relay 100 may also be operated by applying AC voltage to the input terminals. When a positive AC voltage is applied to the input terminal 1, the positive voltage will go through the diode 5 to the current limit resistor 6 of optical coupler 11; current limit resistor 7 of LDR 12; current limit resistor 8 of LDR 13; current limit resistor 10 of LDR 14; current limit resistor 9 of LDR 15; and current limit resistor 33 of LDR 32. The LDR circuits and the optical coupler 100 of the relay 100 are controlled by the input voltage at the input terminals 1 and 2; the LDR and optical coupler IC of this invention may be exchangeable since they have similar functions. Furthermore, the optical coupler may include a phototriac coupler IC and a photothyristor coupler IC, though such devices are not shown.

The switch 18 is a single pole double throw (SPDT) switch. When it is thrown to position S1, it is connected to one terminal of the snubber capacitor 27 of which the other terminal is connected in series to the snubber resistor 29, thus selecting snubber circuit configuration 170A. When the input terminals 1 and 2 have a positive voltage applied thereto, the positive voltage goes through diode 5 and current limit resistor 10 to the LED of LDR 14 and triggers the LED ON. The resistance of the CDS cell of LDR 14 is lowered and the triac 28 is placed in the ON state. The dv/dt voltage of the two terminals of triac 25 of triac circuit 160 is consumed by the snubber resistor 29 so as to protect the triac 25.

Similarly, when the switch 18 is thrown to position S2, the snubber circuit configuration 170B is selected. The dv/dt voltage of triac 25 passes through the snubber capacitor 35 and snubber resistor 36 to the terminal AC1 of the full wave rectifier element 30 and is sent out at the positive terminal to the collector of transistor 31 and the CDS cell of LDR 32. When the input terminals 1 and 2 have a voltage applied thereto, the positive voltage passes through the diode 5 and current limit resistor 33 to the LED of LDR 32 and triggers the LED ON. As a result, the resistance of the CDS cell of LDR 32 lowers and the transistor 31 is turned ON. The dv/dt voltage of the two terminals of the triac 25 falls on the snubber resistor 36 so as to protect the triac 25. The base and emitter circuits of the transistor 31 include a resistor 37 and the voltage of the two terminals of resistor 37 is the voltage 7 of the base and emitter of transistor 31. The transistor 31 can be replaced by a silicon controlled rectifier to perform the same functions.

When the snubber switch 18 is thrown to position S3, the snubber circuit configuration 170C is selected. The dv/dt voltage of triac 25 passes through the snubber capacitor 38 and snubber resistor 39 to terminal MT2 of triac 40 and terminal MT2 of the triac in the phototriac coupler 41. When the input terminals 1 and 2 have positive voltage applied thereto, the positive voltage is applied to the input side of the three-terminal voltage regulator 43, from which a positive voltage is generated at its output side to one terminal of the current limit resistor 42. The other terminal of the resistor 42 is connected to the P junction of the LED of phototriac coupler 41. With its N junction connected to the input terminal 4, the LED will be triggered ON. This places the triac of phototriac coupler 41 in an ON state and the dv/dt voltage passes through terminal MT1 to the gate of triac 40. As a result, the dv/dt voltage passes from terminal MT2 of triac 40 through terminal MT1 to the output terminal 4 and the dv/dt voltage of triac 25 falls on the snubber resistor 39 to protect triac 25. With a resistor 52 connected between the terminal MT1 and the gate of the triac 40, the voltage of the terminal MT1 and the gate of the triac 40 is obtained at the two sides of resistor 52.

Finally, if the switch 18 is thrown to position S4, the snubber circuit configuration 170D is selected. The dv/dt voltage of triac 25 goes through the snubber capacitor 44 and snubber resistor 45 to terminal AC1 of the full wave rectifier 46 and to terminal MT2 of the triacs 47 and 56, and then from the positive terminal of the full wave rectifier 46 to the anode of the SCR of the photothyristor coupler 98. With the cathode connected to the anode of the photothyristor coupler 52, the positive voltage applied to the input terminals 1 and 2 passes through the voltage drop resistor 51 to the N junction of the zener diode 50 and the current limit resistor 49, and to the P junction of the LED of the photothyristor coupler 48. The N junction of the LED is connected to the P junction of the photothyristor coupler 53 of which the N junction is connected to the P junction of the input terminal 2 and the zener diode 50. Therefore, the LED's of photothyristor couplers 48 and 53 are turned ON and their SCR sides are placed in an ON state. The positive voltage passes through the anode of the SCR sides of the photothyristor couplers to the cathode and ultimately to the negative terminal of the full wave rectifier 46. A positive voltage is sent from the terminal AC2 of the full wave rectifier 46 to the gate of the triac 47 and the triac 47 is thus turned ON. Then a positive voltage is applied from the terminal MT1 of the triac 47 to the gate of the triac 55 and the triac 55 is turned ON. The dv/dt voltage of triac 25 falls on the snubber resistor 45 to achieve the purpose of protecting the triac 25. Further, a resistor 54 is provided between the gate and cathode of the triac 55 to make it possible for the gate and cathode to receive voltage.

The foregoing description is intended by way of example only and is not intended to limit the present invention in any way except as set forth in the following claims.

What I claim is:

1. A solid state relay for providing on-off control of AC power to a load, the solid state relay comprising:
   an input circuit including at least two input terminals for receiving a positive voltage, indicative of a desire to provide AC power to the load;
   an output circuit including first and second output terminals, said first output terminal being connected to a first power terminal of an AC power source, said second output terminal being connected through the load to a second power terminal of said AC power source;
   a triac circuit connected to the output circuit and comprising a triac thyristor for effecting on-off control of the AC power source;
   a triac drive circuit connected to the triac circuit for driving said triac circuit;
   a reference voltage circuit for providing a reference voltage to the triac drive circuit;
   an optical coupler circuit connected between the input circuit and the reference voltage circuit for isolating the input circuit from the triac drive circuit;

a plurality of snubber circuits one of which being selected for protecting the triac thyristor of the triac circuit;

switch means for selecting one of said plurality of snubber circuits; and a light dependent resistor circuit connected to the triac drive circuit, snubber circuit, and input circuit, for controlling the triac drive circuit, triac circuit and snubber circuit, in accordance with voltage applied to the input circuit.

2. The solid state relay of claim 1, wherein said input circuit comprises:

first and second input terminals from said at least two input terminals; and an input diode and a current limiting resistor connected in series with said input diode, said input diode being connected to said first input terminal.

3. The solid state relay of claim 2, wherein said optical coupler circuit comprises an optical coupler element having a light emitting diode and a phototransistor having an emitter and a collector, said emitter and collector of the phototransistor being connected to said reference voltage circuit, said light emitting diode being connected in series with said input diode and said current limiting resistor so as to form a series circuit across the first and second input terminals.

4. The solid state relay of claim 3, wherein said light dependent resistor circuit (LDRC) comprises:

an LDRC current limiting resistor connected to said input diode;

an LDRC light emitting diode connected in series between said LDRC current limiting resistor and said second input terminal; and an LDRC photoresponsive resistor associated with said LDRC light emitting diode.

5. The solid state relay of claim 4, wherein said reference voltage circuit comprises:

a zener diode connected across the collector and emitter of said phototransistor of said optical coupler circuit; and a voltage drop resistor connected to the collector of the phototransistor and to the zener diode.

6. The solid state relay of claim 5, wherein said triac drive circuit (TDC) comprises:

a first SCR having an anode, cathode and gate, the gate and anode of said first SCR connected in parallel with said LDRC photoresponsive resistor of said light dependent resistor circuit;

a second SCR having an anode, cathode and gate, the anode of which is connected to said voltage drop resistor of said reference voltage circuit and to the cathode of said first SCR, the gate of said second SCR being connected to the emitter of said photoresponsive transistor of said optical coupler circuit, and the cathode of said second SCR being connected to the reference voltage circuit;

a TDC full wave rectifier having a positive output terminal, a negative output terminal, a first AC input terminal and a second AC input terminal, the positive output terminal of said TDC full wave rectifier being connected to the anode of said first SCR, and the second AC input terminal of said TDC full wave rectifier being connected to the triac circuit;

a third SCR having an anode, cathode and gate, the anode of said third SCR being connected to the cathode of said second SCR and the cathode of said third SCR being connected to the negative output terminal of said TDC full wave rectifier; and a TDC triac thyristor having a first terminal and a second terminal and a gate, said first terminal of said TDC triac thyristor being connected to the first AC input terminal of the TDC full wave rectifier, and the second terminal of said TDC triac thyristor being connected to the triac circuit, the gates of said third SCR and of said TDC triac thyristor being optically coupled to voltage across said first and second input terminals.

7. The solid state relay of claim 6, wherein said triac thyristor of said triac circuit comprises first and second terminals and a gate, the gate of said triac thyristor of said triac circuit being connected to the second AC input terminal of said TDC full wave rectifier of said triac drive circuit, the second terminal of said triac thyristor of said triac circuit being connected to the second terminal of said TDC triac thyristor of said triac drive circuit, and the first terminal of said triac thyristor of said triac circuit being connected to the second output terminal.

8. The solid state relay of claim 7, wherein said switch means comprises first, second, third and fourth switch positions and a switch member movable between said switch positions and connected at one end to a stationary contact, which stationary contact is connected to said first output terminal and to the second terminal of said triac thyristor of said triac circuit, and said plurality of snubber circuits comprises first, second, third, and fourth snubber circuits connected to the first, second, third and fourth switch positions of said switch means, respectively.

9. The solid state relay of claim 8, wherein said first snubber circuit comprises:

a snubber capacitor connected to said first switch position;

a snubber resistor connected in series with said snubber capacitor;

a snubber triac thyristor having first and second terminals and a gate, the second terminal of which being connected to said snubber resistor and the first terminal of which being connected to said second output terminal; and a snubber light dependent resistor having a snubber photoresponsive resistor and a snubber light emitting diode, said snubber photoresponsive resistor being connected to the gate and to the second terminal of said snubber triac thyristor, the snubber light emitting diode being connected at one end to the first input terminal and at another end to the second input terminal.

10. The solid state relay of claim 8, wherein said second snubber circuit comprises:

a snubber capacitor connected to said second switch position;

a snubber resistor connected in series with said snubber capacitor;

a snubber full wave rectifier having first and second AC input terminals, a positive output terminal and a negative output terminal, the first AC input terminal being connected to said snubber resistor, the second AC input terminal being connected to said second output terminal;

a snubber transistor having a base, emitter and collector, the collector and emitter of said snubber transistor being connected to said positive and negative output terminals, respectively, of said snubber full wave rectifier; and a snubber light dependent resistor comprising a snubber light emitting diode and a snubber photoresponsive resistor, said snubber photoresponsive resistor being connected in parallel with said collector and base of said snubber transistor, the snubber light emitting diode being connected to said first and second input terminals.

11. The solid state relay of claim 8, wherein said third snubber circuit comprises:

a snubber capacitor connected to said third switch position;

a snubber resistor connected in series with said snubber capacitor;

a snubber triac thyristor having first and second terminals and a gate, the second terminal of which being connected to said snubber resistor and the first terminal of which being connected to said second output terminal;

a snubber voltage regulator having first and second input terminals and an output terminal, the first and second input terminals of said snubber voltage regulator being connected to the first and second input terminals of said input circuit;

a snubber current limiting resistor connected to the output terminal of said snubber voltage regulator; and a snubber phototriac coupler having a snubber light emitting diode and a phototriac thyristor, the snubber light emitting diode being connected to said snubber current limiting resistor, and the gate and second terminal of said snubber triac thyristor being connected to first and second terminals of said phototriac thyristor of said snubber phototriac coupler.

12. The solid state relay of claim 8, wherein said fourth snubber circuit comprises:

a snubber capacitor connected to said fourth switch position;

a snubber resistor connected in series with said snubber capacitor;

first and second snubber triac thyristors each having first and second terminals and gates, the second terminals of said first and second snubber triac thyristors being connected to said snubber resistor, the gate of said second snubber triac thyristor being connected to the first terminal of said first snubber triac thyristor, the first terminal of said second snubber triac thyristor being connected to the second output terminal;

a snubber full wave rectifier having first and second AC input terminals and positive and negative output terminals, the first AC input terminal being connected to the second terminals of said first and second snubber triac thyristors, the second AC input terminal being connected to the gate of said first snubber triac thyristor;

first and second snubber photothyristor couplers each having a snubber light emitting diode and a snubber SCR, the first and second snubber photothyristor couplers being connected in series, the positive output terminal of said snubber full wave rectifier being connected to an anode of the snubber SCR of said first snubber photothyristor coupler, the negative output terminal of said snubber full wave rectifier being connected to a cathode of the snubber SCR of said second snubber photothyristor coupler;

a snubber voltage drop resistor connected to the first input terminal of the input circuit;

a snubber current limiting resistor connected to said snubber voltage drop resistor and to the snubber light emitting diode of said first snubber photothyristor coupler; and a snubber zener diode having an anode and a cathode, the anode of said snubber zener diode being connected to a cathode of the snubber light emitting diode of said second snubber photothyristor coupler and the second input terminal of said input circuit, and the cathode of said snubber zener diode being connected to a node between the snubber current limiting resistor and the snubber voltage drop resistor.

* * * * *